(12) United States Patent
Racz et al.

(10) Patent No.: US 10,026,880 B2
(45) Date of Patent: Jul. 17, 2018

(54) OPTOELECTRONIC COMPONENT

(71) Applicant: OSRAM Opto Semiconductors GmbH, Regensburg (DE)

(72) Inventors: David Racz, Regensburg (DE); Michael Zitzlsperger, Regensburg (DE); Georg Bogner, Lappersdorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/509,505

(22) PCT Filed: Sep. 8, 2015

(86) PCT No.: PCT/EP2015/070452
§ 371 (c)(1),
(2) Date: Mar. 8, 2017

(87) PCT Pub. No.: WO2016/038009
PCT Pub. Date: Mar. 17, 2016

(65) Prior Publication Data
US 2017/0263829 A1  Sep. 14, 2017

(30) Foreign Application Priority Data
Sep. 9, 2014  (DE) .................. 10 2014 112 973

(51) Int. Cl.
*H01L 33/58* (2010.01)
*H01L 33/48* (2010.01)
(Continued)

(52) U.S. Cl.
CPC .......... *H01L 33/58* (2013.01); *H01L 25/0753* (2013.01); *H01L 33/486* (2013.01);
(Continued)

(58) Field of Classification Search
CPC ..... H01L 33/62; H01L 33/486; H01L 33/502; H01L 25/0753; H01L 2933/0058; H01L 2933/0041; H01L 2933/0066
See application file for complete search history.

(56) References Cited

U.S. PATENT DOCUMENTS

2009/0236619 A1* 9/2009 Chakroborty .......... H01L 33/44
257/89
2011/0220953 A1  9/2011 Bechtel et al.
(Continued)

FOREIGN PATENT DOCUMENTS

DE  102010024864 A1  12/2011
DE  102011050450 A1  11/2012
(Continued)

OTHER PUBLICATIONS

International Search Report based on application No. PCT/EP2015/070452 (3 pages + 3 pages English translation) dated Dec. 22, 2015.
(Continued)

*Primary Examiner* — Caridad Everhart
(74) *Attorney, Agent, or Firm* — Viering Jentschura & Partner mbB

(57) ABSTRACT

An optoelectronic component includes a carrier, a light source formed on the carrier, the light source having at least one luminous face formed by one or more light emitting diodes, wherein an at least partly transparent lamina is arranged on the luminous face, the lamina having a surface facing the luminous face and a surface facing away from the luminous face, wherein at least one conversion layer and a color scattering layer for generating a color by light scattering are arranged on at least one of the facing and facing-away surfaces, wherein the conversion layer is arranged upstream of the color scattering layer relative to an emission direction of light from the luminous face, such that
(Continued)

light emitted by the luminous face can first be converted and then be scattered.

15 Claims, 8 Drawing Sheets

(51) Int. Cl.
  *H01L 33/50* (2010.01)
  *H01L 33/62* (2010.01)
  *H01L 25/075* (2006.01)

(52) U.S. Cl.
  CPC ............ *H01L 33/502* (2013.01); *H01L 33/62* (2013.01); *H01L 2933/0041* (2013.01); *H01L 2933/0058* (2013.01); *H01L 2933/0066* (2013.01); *H01L 2933/0091* (2013.01)

(56) References Cited

U.S. PATENT DOCUMENTS

| | | | | |
|---|---|---|---|---|
| 2012/0305973 | A1* | 12/2012 | Chosa | ............... H01L 33/44 257/98 |
| 2013/0001605 | A1 | 1/2013 | Ishihara et al. | |
| 2013/0200412 | A1 | 8/2013 | Ramchen et al. | |
| 2013/0299865 | A1* | 11/2013 | Bechtel | ............... H01L 33/44 257/98 |
| 2014/0117396 | A1 | 5/2014 | Eisert et al. | |
| 2015/0205159 | A1* | 7/2015 | Itou | ............... G02F 1/133514 349/110 |
| 2015/0333233 | A1 | 11/2015 | Washizu | |

FOREIGN PATENT DOCUMENTS

| | | |
|---|---|---|
| DE | 102011087614 A1 | 6/2013 |
| DE | 102012206966 A1 | 10/2013 |
| EP | 2448017 A2 | 5/2012 |
| WO | 2014104295 A1 | 7/2014 |

OTHER PUBLICATIONS

German Search Report based on application No. 10 20147 112 973.3 (6 pages) dated Jul. 17, 2015.

* cited by examiner

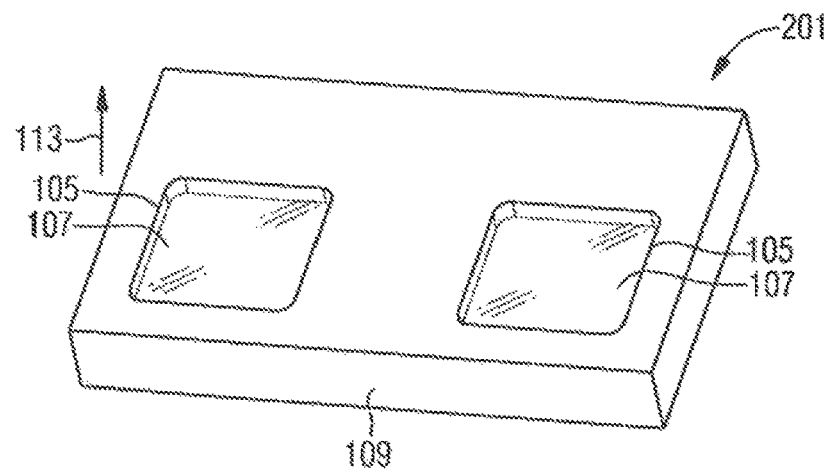
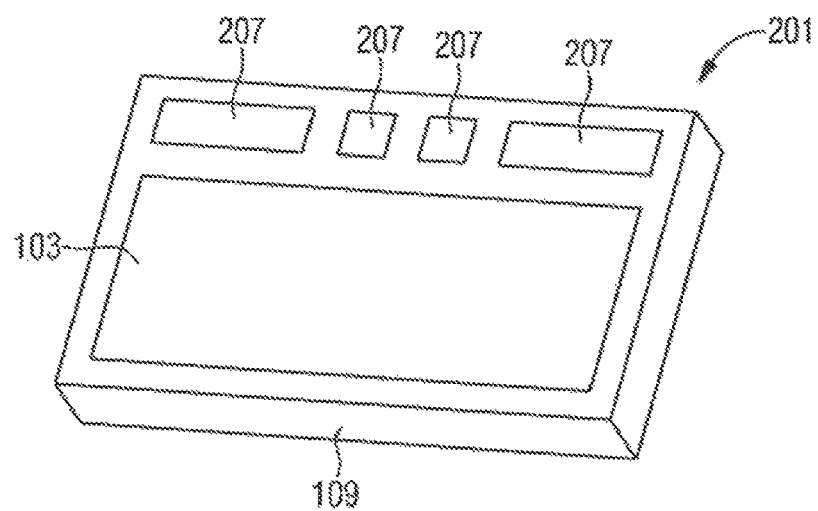

(A-A')

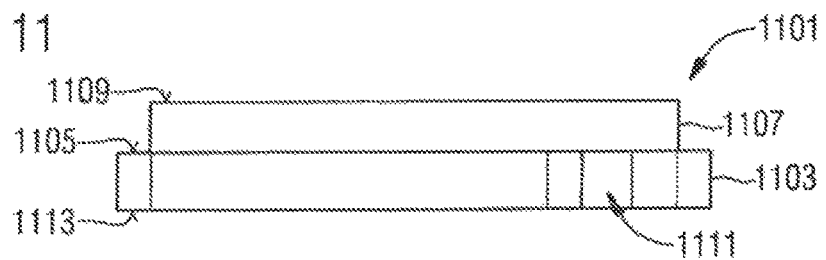
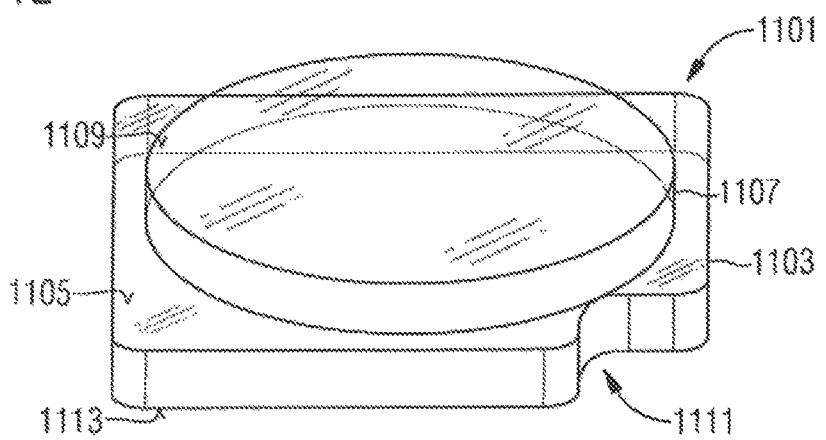
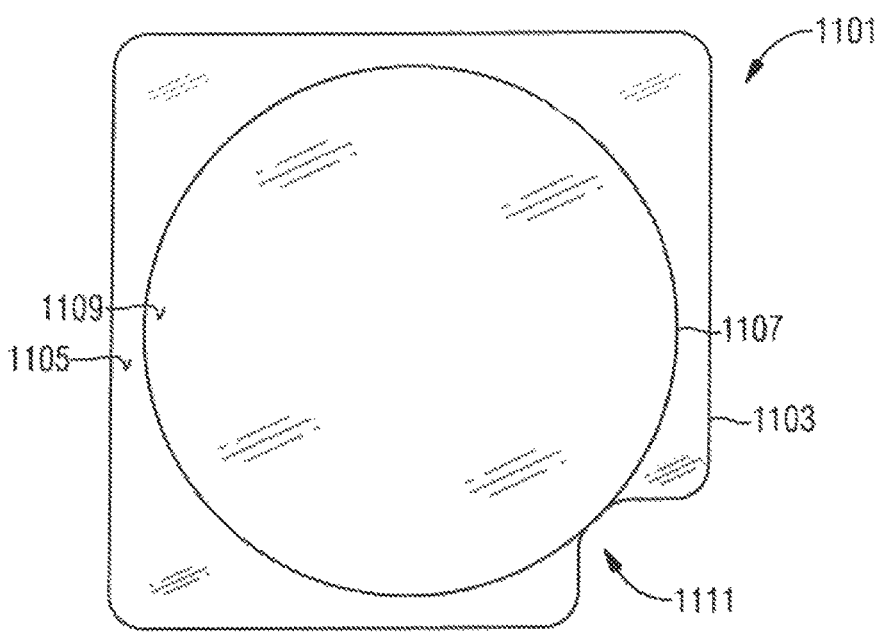

OPTOELECTRONIC COMPONENT

RELATED APPLICATIONS

The present application is a national stage entry according to 35 U.S.C. § 371 of PCT application No.: PCT/EP2015/070452 filed on Sep. 8, 2015, which claims priority from German application No.: 10 2014 112 973.3 filed on Sep. 9, 2014, and is incorporated herein by reference in its entirety.

TECHNICAL FIELD

The present disclosure relates to an optoelectronic component. The present disclosure furthermore relates to a method for producing an optoelectronic component.

BACKGROUND

In the case of a carrier with light emitting diodes arranged thereon, for example, generally color differences or inhomogeneities, for example as a result of the substrate or the carrier, a metallization, conversion layers (for example phosphor layers) or wires, may occur and be perceived as visually disturbing for an observer. This is the case particularly when the light emitting diode is switched off, that is to say is not emitting any light.

Therefore, there is a need to reduce or even completely avoid these inhomogeneities in the visual impression.

Furthermore, it is desirable to provide an optoelectronic component which is as flat and mechanically robust as possible.

The problem addressed by the present disclosure can therefore be considered that of providing an improved optoelectronic component which overcomes the known disadvantages and has a more homogeneous visual impression and is mechanically robust and stable.

The problem addressed by the present disclosure can also be considered that of specifying a corresponding method for producing an optoelectronic component.

SUMMARY

These problems are solved by the respective subject matter of the independent claims. Advantageous configurations of the present disclosure are the subject matter of respectively dependent subclaims.

According to one aspect, an optoelectronic component is provided, including:
  a carrier,
  a light source formed on the carrier,
  said light source having at least one luminous face formed by one or more light emitting diodes, wherein
  an at least partly transparent lamina is arranged on the luminous face,
  said lamina having a surface facing the luminous face and a surface facing away from the luminous face, wherein
  at least one conversion layer and a color scattering layer for generating a color by light scattering are arranged on at least one of the facing and facing-away surfaces, wherein
  the conversion layer is arranged upstream of the color scattering layer relative to an emission direction of light from the luminous face, such that light emitted by the luminous face can first be converted and then be scattered.

In accordance with a further aspect, a method for producing an optoelectronic component is provided, in particular the optoelectronic component according to the present disclosure, including the following steps:
  providing an at least partly transparent lamina having two opposite surfaces,
  forming at least one conversion layer and a color scattering layer for generating a color by light scattering on at least one of the surfaces of the lamina,
  providing a carrier, on which is formed a light source having at least one luminous face formed by one or more light emitting diodes,
  arranging the lamina on the luminous face, such that one of the surfaces of the lamina forms a surface facing the luminous face and the other surface of the lamina forms a surface facing away from the luminous face, such that
  the conversion layer is arranged upstream of the color scattering layer relative to an emission direction of light from the luminous face, such that light emitted by the luminous face can first be converted and then be scattered.

The present disclosure thus encompasses the concept, in particular, of providing an at least partly transparent lamina which has a dual function: conversion and bringing about a specific color in the switched-off state of the component, that is to say when no light is being emitted. A uniform optical appearance is advantageously brought about as a result. Inhomogeneities are covered at least partly, in particular completely, by the color scattering layer. Such inhomogeneities may originate for example from bonding wires or different colors of the individual elements of the component. A homogeneous visual impression is thus advantageously brought about when the color scattering layer is viewed in the direction of the optoelectronic component. This is because possible inhomogeneities, contrasts or different colors are advantageously covered or at least partly covered by the color scattering layer. In particular, the color scattering layer advantageously brings about an optical compensation of possible inhomogeneities. A homogeneous visual impression is thus advantageously brought about. This is the case particularly when the light source is not emitting any light, that is to say is switched off, in other words is in a switched-off operating state.

This more homogeneous overall impression is brought about, in particular, by virtue of the fact that the color scattering layer reflects or scatters only specific wavelengths or a specific wavelength range of incident light. The color scattering layer thus reflects or scatters (in the case of scattering, reflection is intended always to be inferred as well, and vice-versa) light incident on its surface facing away from the luminous face only in a specific wavelength range. A specific color impression thus advantageously arises. This is advantageous in particular for design reasons (in particular with regard to an industrial design). In particular, the color is generated by the scattering. On account of the color scattering layer, it is true that a light coupling-out efficiency of the optoelectronic component deteriorates in comparison with the case where no additional color scattering layer is provided. However, this disadvantage is deliberately accepted since the advantages of the dual function (generating a color and conversion) of a lamina distinctly outweigh the disadvantage of the deteriorated light coupling-out efficiency.

"Facing away" and "facing" in connection with the surfaces of the lamina relate to the luminous face.

In one embodiment, the conversion layer is arranged on the facing surface of the lamina, wherein the color scattering layer is arranged on the facing-away surface of the lamina.

In another embodiment, the conversion layer and the color scattering layer are arranged on the facing surface of the lamina.

In a further embodiment, the conversion layer and the color scattering layer are arranged on the facing-away surface of the lamina.

According to one embodiment, the color scattering layer includes color scattering media. The color scattering media are particles, for example, which can also be referred to as color scattering particles, wherein the particles can reflect or scatter light in a specific wavelength range. The color reflected or scattered by the color scattering layer can be used as identification for designating the color scattering layer. In the case of scattering of red, the color scattering layer can be designated as a red color scattering layer. In the case of scattering of white, the color scattering layer can be designated as a white color scattering layer.

According to one embodiment, the particles are, for example, titanium dioxide and/or aluminum oxide particles and/or $ZrO_2$ particles. This affords the technical advantage, in particular, that white light can be reflected and/or scattered. Particularly in the case of a white color scattering layer, it is advantageously possible to increase a luminous efficiency in a switched-off state of the component.

The direct arrangement of the lamina on the luminous face furthermore advantageously brings about protection of the luminous face, that is to say of the diode or diodes. In particular, dissipation of heat generated by the diodes during operation is brought about via the lamina. The lamina is thus not arranged at a distance from the luminous face, but rather is connected to the luminous face, in particular, connected by an adhesive layer, advantageously a transparent adhesive layer.

According to one embodiment, it is provided that the lamina is arranged on the luminous face or, respectively, is arranged onto the luminous face by an adhesive layer. That is to say that the lamina is adhesively bonded onto the luminous face, respectively, is adhesively bonded on the luminous face. A cohesive connection is thus formed between the lamina and the luminous face.

According to one embodiment, it is provided that the lamina is completely transparent.

Transparent in the sense of the present disclosure means, in particular, that the lamina has a transmittance of at least 85% in at least one (or a plurality or all) of the wavelength ranges mentioned below: 400 nm to 700 nm, 700 nm to 1 µm, 700 nm to 3 µm, 850 nm to 1000 nm.

A conversion layer in the sense of the present disclosure is advantageously designed to convert light of a first wavelength or a first wavelength range into light of a second wavelength or a second wavelength range. In particular, the conversion layer includes one or more phosphors, that is to say is, in particular, a phosphor layer. The conversion layer thus converts, in particular, the light emitted by the luminous face advantageously into light having a different wavelength than said light.

According to a further embodiment, it is provided that the lamina has at least one light-nontransmissive region. This affords the technical advantage, in particular, that an increase or an enhancement of the contrast between the luminous face and surroundings of the component is brought about. This is advantageous particularly if, by way of example, a secondary optical unit, for example a lens, is also arranged or placed on the transparent lamina. This is because said secondary optical unit will at least partly reflect light emitted by the lamina back again in the direction of the lamina, which will in turn reflect said light. A multiple reflection occurs here, for example, which may lead to a less expedient overall visual impression and to a reduced contrast. However, said light-nontransmissive region reduces said multiple reflections, such that an increase in contrast is brought about as a result. Advantageously, a plurality of light-nontransmissive regions are formed, which are formed for example identically or for example differently.

Instead of or in addition to the at least one light-nontransmissive region, according to one embodiment it is provided that the lamina has a region which has a lower or smaller transmission than the rest of the lamina, but is still transmissive to light, that is to say has a transmission of greater than zero. The lamina thus has at least one region (or a plurality of such regions which are formed in particular identically or advantageously differently) having a lower transmission. Features and embodiments with regard to the light-nontransmissive regions analogously apply to the region having the lower transmission, and vice-versa.

According to one embodiment, it is provided that the light-nontransmissive region (and/or the region having the lower transmission) has a structure and/or a coating. An at least partial extinction of light rays incident on the structure is advantageously brought about by a correspondingly adapted structure. This, too, advantageously increases a contrast. The coating is a metal layer, for example, which advantageously has a thickness of a few µm (1 µm to 10 m, in particular 1 µm to 8 µm, in particular 1 µm to 5 µm, in particular 1 µm to 3 µm). The region includes for example a colored silicone, for example epoxy resin, and/or some other plastic. By way of example, the region includes a mechanical cover.

According to one embodiment, it is provided that the structure is embossed or, respectively, has been embossed. That is to say that the structure has been embossed on the lamina, in particular on the facing-away surface.

In accordance with another embodiment, it is provided that the lamina is embodied as a lens. This affords the technical advantage, in particular, that an optical imaging of the emitted light is possible. The lens is, for example, a concave, convex, planoconvex or Fresnel lens. That is to say that the lamina acts as an optical element. The lamina is thus formed in particular as an optical element. In particular, a coupling-out structure is applied or arranged on the lamina. Said coupling-out structure advantageously improves coupling-out of light. By way of example, the coupling-out structure is introduced by etching on the facing-away surface. That is to say that the coupling-out structure has been etched in or, respectively, is etched in.

In another embodiment, it is provided that the lamina has an alignment structure for aligning a further component relative to the lamina. This affords the technical advantage, in particular, that a further component can be placed onto the lamina simply and accurately. By way of example, the further component is a secondary optical unit. Even if the optoelectronic component is integrated in further components, for example a housing, nevertheless a lamina having an alignment structure is also advantageous. This is because, in the case of such an integration, the optoelectronic component generally has to be aligned and has to assume a specific position relative to the further component or the further components. This predefined position can be assumed by the alignment structure. In particular, this advantageously makes it possible to determine a deviation between the desired position and the actual position of the component relative to the further component or further components. Accordingly, provision is then made, in particular, for implementing suitable countermeasures.

In another embodiment, it is provided that the lamina has a cavity on its facing-away surface, at least one of the conversion layer and the color scattering layer being arranged in said cavity. The wording "at least one of the" stands for "and/or". That is to say that the wording "at least one of the conversion layer and the color scattering layer" stands for the wording "the conversion layer and/or the color scattering layer". That is to say that according to this embodiment, it is provided that the lamina has a cavity on its facing-away surface, the conversion layer and/or the color scattering layer being arranged in said cavity.

A cavity in the present disclosure denotes, in particular, a depression. Providing such a cavity advantageously affords the possibility of producing a planar surface of the lamina by forming enough of the layer until the layer is flush with the upper edge of the cavity or depression. If the cavity is still not completely filled, then advantageously space still remains for applying the additional layer, for example conversion and/or color scattering layer, after the mounting of the component, that is to say in particular after the arrangement of the lamina on the luminous face.

In accordance with a further embodiment, it is provided that the lamina has a mechanical structure designed to be used for a further processing process of the component. This affords the technical advantage, in particular, of enabling a simple further processing of the component after the arrangement of the lamina on the luminous face.

In another embodiment, it is provided that the mechanical structure has a groove on the lamina edge and/or a stop edge for a potting process. The stop edge advantageously indicates to what point or how much pouring is permitted in the potting process. This affords the technical advantage, in particular that a potting process can be carried out more simply. In particular, use of too much potting compound can thus be avoided. The groove can advantageously be used for example for pouring in a light-absorbing plastic, such that the groove with the plastic poured in forms the region having a lower transmission or the light-nontransmissive region.

According to one embodiment, the potting compound includes titanium dioxide.

According to another embodiment, it is provided that the facing surface has a cutout in which an electrical contacting of the light source is arranged. Contactings, bonding wires, for the diodes are usually provided on the surface of the carrier. They generally require space. Depending on the required space in the specific application and depending on the specific size of the lamina, a collision between lamina and contacting could occur. That is advantageously avoided by the provision of the cutout.

According to one embodiment, it is provided that the cutout is formed by etching. That is to say that the cutout is an etched cutout.

In accordance with a further embodiment, it is provided that the lamina has an elevated structure. This affords the technical advantage, in particular, that a particular optical effect or a particular optical appearance can be brought about. By way of example, the emission face, that is to say the luminous face appears round in the case of a round elevated structure. In particular, the elevated structure is formed such that it is centered relative to that surface of the lamina from which the structure rises. In particular, the elevated structure and the surface have a common center. The surface from which the structure rises thus forms a base surface for the structure. In particular, the lamina thus includes a base having a base surface from which the structure rises.

That is to say that according to one embodiment, it is provided that the elevated structure is round.

In another embodiment, it is provided that the light source and the lamina are encapsulated by molding and are potted up to an upper edge of the lamina, said upper edge facing away from the light source by a potting compound, such that the potting compound is flush with the upper edge. This affords the technical advantage, in particular, that a good mechanical protection of the lamina and of the light source is provided. By the potting up to the upper edge of the lamina, a planar surface is advantageously created, on which, for example, a secondary optical unit or any other further component can be placed in a simple manner. This advantageously brings about a visually appealing appearance. In particular, the mounting of a secondary optical unit is advantageously facilitated as a result. Molding advantageously corresponds to injection molding and has the advantage of the harder material and the more defined surface geometry. This is in comparison with potting. Here the potted material is softer relative thereto and the surface generally forms menisci, that is to say a less defined surface geometry than in the case of molding.

Molding in the sense of the present disclosure denotes in particular transfer molding, in particular foil assisted transfer molding. That is to say that the molding is based on a transfer molding method, in particular a foil assisted transfer molding method. This is in contrast to a traditional potting process, in which a homogeneous and planar surface cannot arise. In the meantime, in the course of transfer molding, in particular in the course of foil assisted transfer molding, the electronic components (diode, chips, NTC sensor, further electronic components) and further components can be completely embedded. This advantageously gives rise to a defined and smooth surface. If, in the sense of the present disclosure, only potting is written, nevertheless molding is intended always to be inferred as well.

According to a further embodiment, it is provided that the potting compound has a color identical to the color generated by the color scattering layer. This affords the technical advantage, in particular, that a uniform optical appearance is provided. It is no longer possible or it is possible only with difficulty to distinguish between lamina and potting compound. This is desired here. In particular, this is desired for design reasons.

According to another embodiment, it is provided that the lamina is formed from at least one of the following group of elements: glass, transparent ceramic, silicone, hybrid material, in particular silicone/epoxy, plexiglas and sapphire.

Glass, transparent ceramic and sapphire afford the advantage, in particular, that they are particularly hard and mechanically stable.

Glass, transparent ceramic, silicone and hybrid material, in particular silicone/epoxy, and sapphire afford the advantage, in particular, that they are resistant to aging.

Plexiglas affords the advantage, in particular, that it is inexpensive and simple to process.

According to another embodiment, it is provided that the lamina with the conversion layer and the color scattering layer is measured in respect of an optical property before being arranged on the luminous face, wherein the lamina is arranged on the luminous face only if the measured optical property corresponds to a predetermined reference property. This affords the technical advantage, in particular, that laminae which do not fulfill specific properties can thereby be segregated prior to being arranged. This advantageously reduces yield losses in comparison with the case where the optical property is measured only after the arrangement of the lamina. For in that case it is generally necessary for the entire component to be segregated, rather than just a lamina.

According to another embodiment, it is provided that the light source with the lamina arranged on the luminous face are encapsulated by molding and are subsequently potted up to an upper edge of the lamina, said upper edge facing away from the light source by a potting compound, such that the potting compound is flush with the upper edge.

Explanations, advantages, features, technical effects such as are described in connection with the device analogously apply to the method, and vice-versa.

According to one embodiment, a plurality of light sources are formed on the carrier. The plurality of light sources are formed for example identically or in particular differently.

In a further embodiment, a plurality of luminous faces are provided. The plurality of luminous faces are formed in particular identically or advantageously differently. According to one embodiment, the plurality of light emitting diodes are formed identically or for example differently.

In the case of a plurality of luminous faces, according to one embodiment it is provided that an individual or a single lamina is provided, which is arranged on the plurality of luminous faces.

In the case of a plurality of luminous faces, according to another embodiment it is provided that in each case an individual lamina is arranged on each luminous face.

In the case of a plurality of luminous faces, according to a further embodiment it is provided that in each case an individual lamina is arranged on one or a plurality of luminous faces, wherein a common lamina is arranged on one or a plurality of further luminous faces, wherein it is advantageously provided that a plurality of laminae are provided which are arranged in each case jointly on a plurality of luminous faces.

According to one embodiment, the light emitting diode is a laser diode. This affords the technical advantage, in particular, that a high light power and advantageously a high luminance can be provided.

In one embodiment, the light emitting diode is formed as an LED chip. LED stands for "light emitting diode".

According to one embodiment, the color scattering layer is a white color scattering layer. In further embodiments, the color scattering layer is a red, yellow, green, orange or violet color scattering layer. In particular, arbitrary colors are provided. This is dependent, in particular, on the specific application.

According to one embodiment, the color scattering media or the color scattering particles are non-fluorescent color scattering media or non-fluorescent color scattering particles. That is to say, in particular, that the color scattering particles do not fluoresce upon excitation by the light emitted by the luminous face.

In one embodiment, the carrier is a leadframe.

In one embodiment, a thickness of the lamina is 60 µm to 400 µm. In general, the following holds true: the thinner the lamina, the more easily heat can be dissipated therefrom, and the less expensive it is. The thicker the lamina, the better it can be structured mechanically and the mechanically stabler it is.

According to one embodiment, a plurality of conversion layers and/or color scattering layers are provided, which are arranged for example alongside one another or one above another on the respective surface.

BRIEF DESCRIPTION OF THE DRAWINGS

The above-described properties, features and advantages of this present disclosure and the way in which they are achieved will become clearer and more clearly understood in association with the following description of the embodiments which are explained in greater detail in association with the drawings.

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 3 shows a plan view obliquely from above of the further component in accordance with FIG. 2, wherein the potting compound is not depicted in a see-through fashion, FIG. 4 shows an oblique plan view of the underside of the component according to FIG. 2.

Hereinafter, identical reference signs may be used for identical features. Furthermore, it may be provided that in some drawings some features are illustrated only schematically or incompletely or are entirely absent. This is intended to provide better clarity.

DETAILED DESCRIPTION

Figure 1:
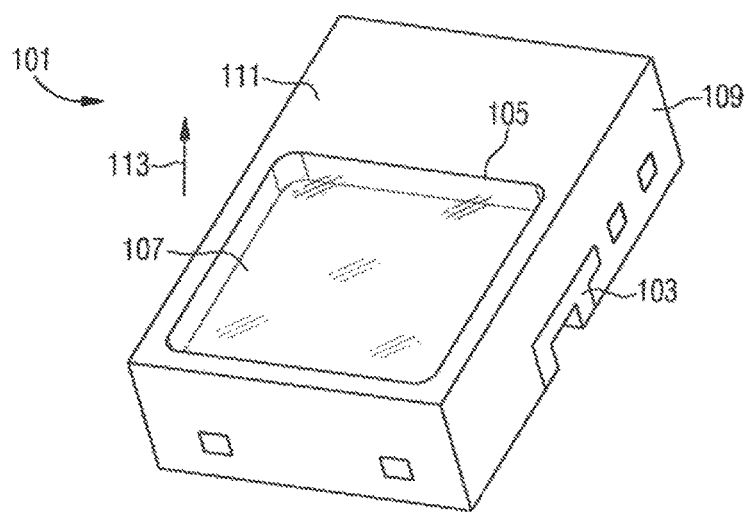
FIG. 1 shows a plan view obliquely from above of an optoelectronic component.

FIG. 1 shows a plan view obliquely from above of an optoelectronic component 101.

The individual elements of the component 101 have already been potted by a white potting compound 109, such that not all of the elements of the component 101 are visible, some elements being at least partly visible. For example, a carrier 103 is partly visible. A light source is formed on said carrier 103, said light source not being visible in the illustration shown in FIG. 1. In this respect, the light emitting diode which forms a luminous face of the light source is not visible either.

However, a transparent lamina 105 having a conversion layer 107 is shown and visible. The conversion layer 107 is arranged on a surface of the lamina 105 facing the luminous face. For a better illustration of the facing surface and a surface of the lamina facing away from the luminous face, reference is made to the sectional drawings in the figures still to follow.

For the sake of clarity, a color scattering layer for generating a color by light scattering is likewise not illustrated.

Said color scattering layer is arranged on the facing-away surface of the lamina 105, that is to say opposite the conversion layer 107.

Relative to an emission direction of the light emitted by the luminous face, the color scattering layer is arranged downstream of the conversion layer 107. That is to say that, relative to the emission direction, the conversion layer 107 is arranged upstream of the color scattering layer. The emission direction is identified symbolically here by an arrow bearing the reference sign 113.

The individual elements of the component 101 are potted. This is done by the potting compound 109. That is to say that after potting the potting compound 109 forms a housing for the individual elements of the component 101.

The reference sign 111 points to a location of a protective diode associated with the component 101, wherein the protective diode is likewise potted by the potting compound 109. The protective diode 111 is provided in order to afford protection against electrostatic discharges. The protective diode may in this respect be designated in particular as an ESD diode, where "ESD" stands for the term "electrostatic discharge".

The carrier 103 is coated with gold, in particular. Advantageously, the carrier 103 is a leadframe.

Figure 2:
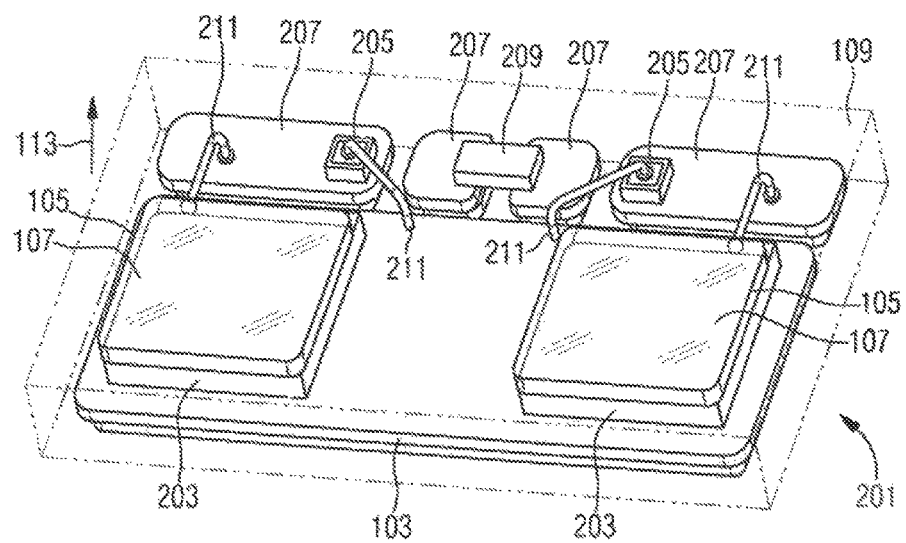
FIG. 2 shows a plan view obliquely from above of a further optoelectronic component, wherein a potting compound is illustrated in a see-through fashion.

FIG. 2 shows a plan view obliquely from above of a further optoelectronic component 201. For better illustration of the elements of the component 101, the white potting compound 109 is depicted in a see-through fashion, which of course is not the case in reality. Individual elements of the component 201 are now visible as a result. As shown in FIG. 2, the component 201 includes a carrier 103, on which two luminous faces 203 are formed. Each of the luminous faces 203 includes a light emitting diode, which is not illustrated in detail for the sake of clarity. The two luminous faces here form a light source.

Two protective diodes 205 are now visible, which can also be designated as ESD diode hereinafter. Thus two ESD diodes 205 for the purpose of protecting each of the two light emitting diodes against electrostatic discharges.

Further carriers 207 are visible and shown, said further carriers being formed separately from the carrier 103, wherein the ESD diodes 205 and an NTC temperature sensor 209 are arranged on the further carriers 207 (NTC stands for "Negative Temperature Coefficient Thermistors", that is to say denotes an NTC thermistor). In an exemplary embodiment that is not shown, it is provided that the further carriers 207 are formed integrally with the carrier 103. That is to say that, in this exemplary embodiment that is not shown, the further carriers 207 are part of the carrier 103. That is to say that here the ESD diodes 205 and also the NTC temperature sensor 209 are then arranged jointly on the carrier 103.

The reference sign 211 points to bonding wires for an electrical connection between the individual elements of the component 101, in particular for an electrical contacting of the light emitting diodes and the ESD diodes 205.

It is noted at this juncture that not all of the details of electrical contactings are shown in the drawings, for the sake of clarity. In particular, said electrical contactings are in part merely indicated schematically.

A transparent lamina 105 is provided per luminous face, said lamina being formed analogously to the component 101 in accordance with FIG. 1 and being arranged, for example adhesively bonded, on the respective luminous face 203.

FIG. 3 shows a plan view obliquely from above of the component 201 in accordance with FIG. 2, wherein now the potting compound 109 is no longer depicted in a see-through fashion, but rather in a non-see-through fashion. The color of the potting compound 109 is white. The color scattering layer (not illustrated) is likewise a white color scattering layer, such that it is no longer possible to distinguish between lamina 105, on the one hand, and potting compound 109, on the other hand. A homogeneous overall visual image is advantageously brought about as a result.

FIG. 4 shows a plan view of the underside of the component 201 in accordance with FIG. 2.

Figure 5:
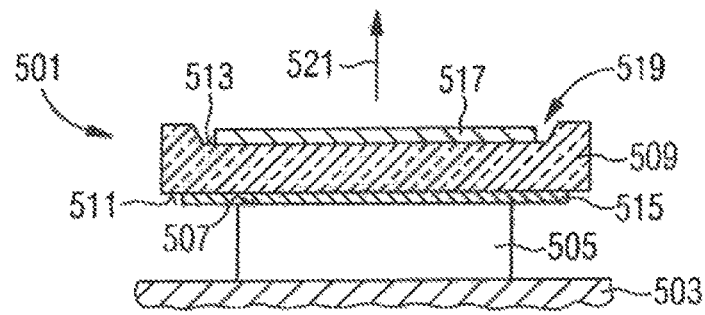
FIG. 5 shows a lateral sectional view of another optoelectronic component.

FIG. 5 shows a lateral sectional view of a further optoelectronic component 501.

The carrier 503 of the component 501 is merely indicated schematically here. A light source 505 is arranged or formed on the carrier 503. Said light source 505 has a light emitting diode (not shown) which forms a luminous face 507.

On account of the lateral sectional view chosen, a surface 511 of an at least partly transparent lamina 509, said surface facing the luminous face 507, is illustrated. That surface of the lamina 509 which faces away from the luminous face 507 is identified by the reference sign 513. A conversion layer 515 is formed on the facing surface 511. A color scattering layer 517 is formed on the facing-away surface 513. Relative to an emission direction of the light emitted by the luminous face 507, the color scattering layer 517 is arranged downstream of the conversion layer 515. That is to say that, relative to the emission direction, the conversion layer 515 is arranged upstream of the color scattering layer 517. The emission direction is identified symbolically here by an arrow bearing the reference sign 521.

The reference sign 517 points to the color scattering layer arranged on the facing-away surface 513 of the lamina 509. In this case, a cavity 519 is formed on the facing-away surface 513, the color scattering layer 517 being arranged in said cavity.

Figure 6:
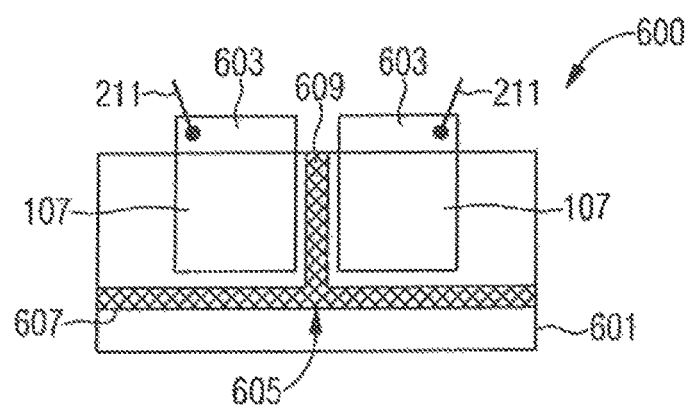
FIG. 6 shows a plan view of a further optoelectronic component.

FIG. 6 shows a further optoelectronic component 600 in a plan view from above. Not all of the elements of the component 600 are depicted.

An at least partly transparent lamina 601 is depicted, which is arranged on the two LED chips 603 of the component 600. The LED chips 603 in each case form a luminous face 107. That is to say that, in contrast to the embodiment in accordance with FIG. 2, one lamina 601 covers two luminous faces and is arranged thereon. In FIG. 2, a dedicated lamina is provided for each luminous face.

The lamina 601 is at least partly transparent since it has a structure 605 that is formed in a nontransparent fashion. Instead of or in addition to the structure 605, a coating is provided in an embodiment that is not shown. The structure 605 has a portion 607 extending over the entire length of the lamina 601. A further portion 609 of the structure 605 is formed centrally between the two LED chips 603, wherein said further portion 609 is arranged perpendicularly to the portion 607. That is to say that the structure 605 has a T-shape. Said structure 605 serves for increasing the contrast between the LED chips 603 and surroundings of the component 600. Alternatively, it is provided, in particular, that the structure is formed as a region having a reduced transmission (but still in a transparent fashion, that is to say having a transmission of greater than zero) compared with the transmission of the rest of the lamina 601.

Figure 7:
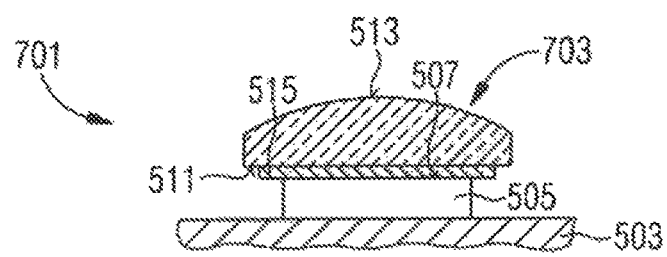
FIG. 7 shows a lateral sectional view of another optoelectronic component.

FIG. 7 shows a further optoelectronic component 701. Here, too, the carrier 503 is merely indicated schematically. This also applies to the light source 505. The luminous face 507 is covered with a lamina 703. That is to say that the lamina 703 is arranged on the luminous face 507. Here, too, the conversion layer 515 is arranged on the surface 511 of the lamina 703 which faces the luminous face 507. The color scattering layer is not shown, for the sake of clarity, but is arranged on the facing-away surface 513.

In the embodiment in accordance with FIG. 7, the transparent lamina 703 is embodied as an optical element, here for example as a planoconvex lens.

Figure 8:
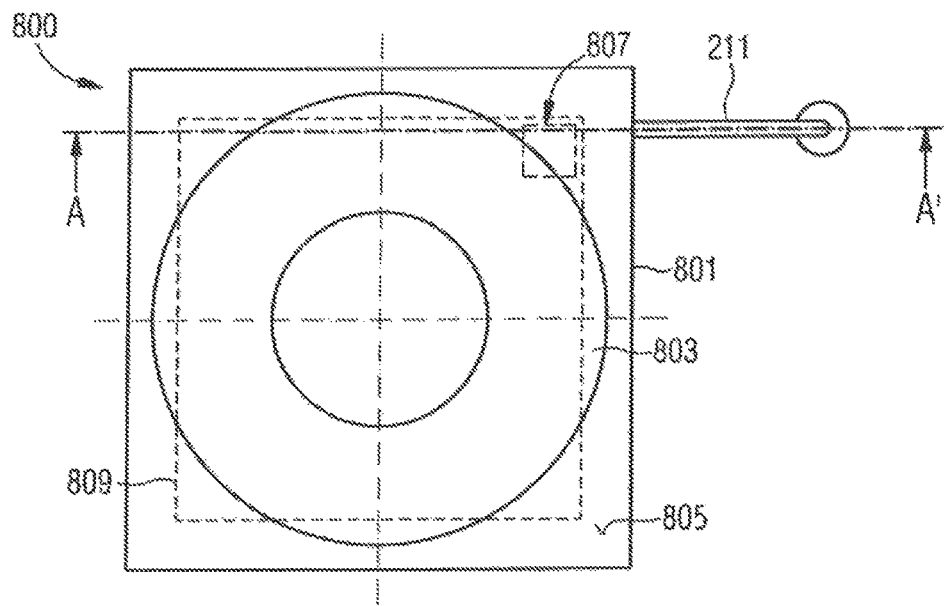
FIG. 8 shows a plan view of a further optoelectronic component.

FIG. 8 shows a plan view from above of another optoelectronic component 800. Here, too, a transparent lamina 801 is provided, which has a conversion layer 803 on that surface which faces a luminous face of the component 800. That surface which faces away from the luminous face is provided with the reference sign 805. The carrier for the luminous face is identified by the reference sign 809, and the light source by the reference sign 811. The reference sign 807 points to a corner bonding pad for a bonding wire 211.

Figure 9:
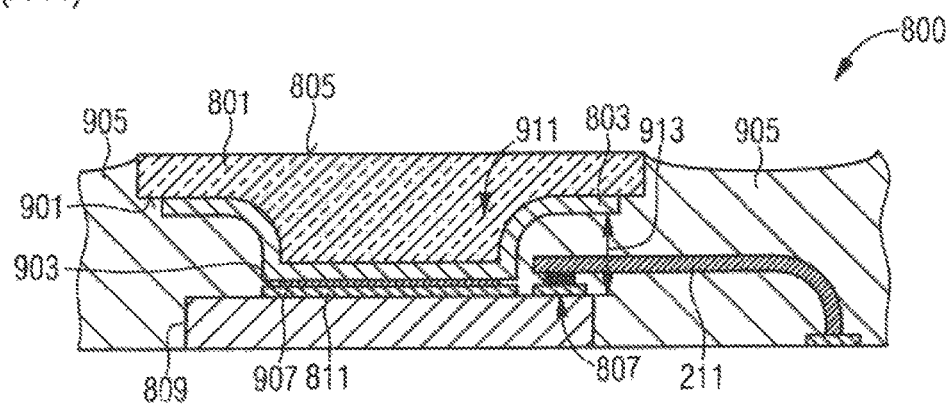
FIG. 9 shows a lateral sectional view of the optoelectronic component in accordance with FIG. 8.

FIG. 9 shows a lateral sectional view of the component 800 in accordance with the sectional line A-A' from FIG. 8.

The facing surface bears the reference sign 901. The luminous face bears the reference sign 903.

On account of the corner bonding pad 807 arranged in a corner region of the carrier 809, the lamina 801 must have a cutout 911 in this region, said cutout being etched in particular from the glass lamina 801. As a result, the glass lamina 801 can advantageously be formed such that it is larger than the carrier 809. That is to say that the lamina 801 projects beyond the carrier 809. Here, too, the individual elements of the component 800 have been potted by a potting compound 905. Analogously to FIG. 1, here, too, the potting compound 905 forms a housing for the elements of the component 800, although the housing is not illustrated completely here, but rather is illustrated in a truncated version.

The reference sign 913 points to a double-headed arrow that is intended to represent the distance between an upper edge of the etched cutout 911 and the upper edge of the carrier 809. Said distance is 150 μm, for example.

This embodiment in accordance with FIGS. 8 and 9 thus encompasses the concept, in particular, of using an etched glass lamina in order to form a cutout in order to have a sufficient distance between an upper edge of the carrier and a lower edge of the lamina in a defined region. This creates space in which, for example, there is room for a contacting, in particular a corner bonding pad and a bonding wire. This is advantageous particularly if the contacting is a reverse bond. After etching, it is then provided, in particular, that the conversion layer 803 is sprayed onto the corresponding surface. The bonding wire 211 is concealed in the potting compound after potting. The potting compound or molding compound is for example a silicone including titanium dioxide.

By way of example, it is provided that the lamina is sawn out in a rectangular fashion with an edge length a and is mounted onto the chip after the bonding of the chip onto the carrier 809.

It is provided, in particular, that during the etching of the glass lamina, structures for round, square or rectangular chips, in particular chip mesas, are produced, but mesas with a bonding pad can also be produced. Mesa denotes the semiconductor structure (for example GaAs, InGaAlP) of an LED chip. The semiconductor structure is applied on a carrier material (for example Ge). A region of the carrier material is free of the semiconductor structure. A metallic bonding pad is arranged on said region. Such LED chips are provided according to one embodiment.

Figure 10:
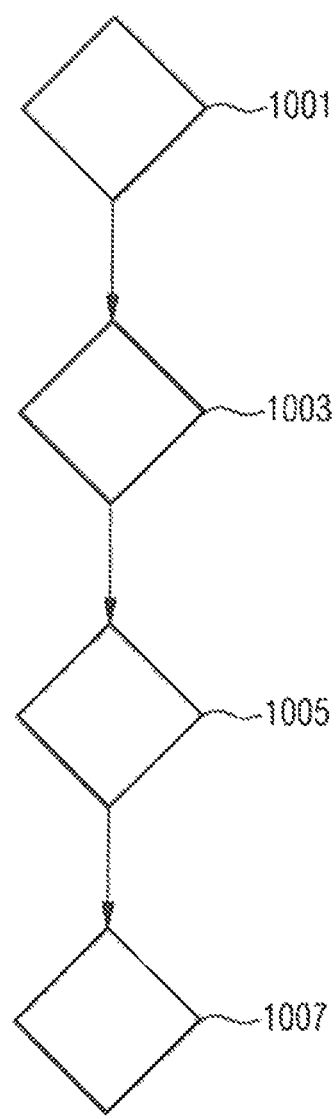
FIG. 10 shows a flow diagram of a method for producing an optoelectronic component, FIGS. 11 to 13 in each case show a lamina in different views.

FIG. 10 shows a flow diagram of a method for producing an optoelectronic component.

A step 1001 involves providing an at least partly transparent lamina having two opposite surfaces. A step 1003 involves forming at least one conversion layer and at least one color scattering layer for generating a color by light scattering on at least one of the surfaces of the lamina. A step 1005 involves providing a carrier, on which is formed a light source having at least one luminous face formed by one or more light emitting diodes. A step 1007 involves arranging the lamina onto the luminous face, such that one of the surfaces of the lamina forms a surface facing the luminous face and the other surface of the lamina forms a surface facing away from the luminous face, such that the conversion layer is arranged upstream of the color scattering layer relative to an emission direction of light from the luminous face, such that light emitted by the luminous face can first be converted and then be scattered.

To summarize, the present disclosure is based, in particular, on a combination of the following features:

1. Defined thickness of the lamina, wherein the thickness is in particular in the region of 100 μm, advantageously between 60 μm and 400 μm.

2. A mechanical stability of the lamina and of the housing. The housing is formed in particular by a potting process and/or by a molding, that is to say a molding process. Generally, in the case of potting compound, the intention is for molding compound always to be inferred as well.

3. Conversion. This is brought about in particular by the conversion layer. This is produced cost-effectively, in particular by virtue of the conversion layer being formed or having been formed, respectively, on glass, that is to say on a glass lamina.

4. So-called "offstate color", that is to say a visual color impression of the component in a switched-off state of the light sources, that is to say when the latter are not emitting light. This color impression in the switched-off state is brought about in particular by the color scattering layer.

It is proposed here to coat a transparent lamina. The transparent lamina may consist, for example, of glass, transparent ceramic, silicone, hybrid material (silicone/epoxy), plexiglas, sapphire, etc. In one embodiment, the lamina can be produced as follows:

1. Coating the top side with one or more conversion layers (one above another or alongside one another). By way of example, spray coating and/or molding (that is to say a molding process) can be used here.

2. Coating the rear side with a white film, for example $TiO_2$.

3. Singulating the laminae.

4. Electro-optical characterization.

A further alternative/modified production method in accordance with another embodiment:

1. Coating the top side with a white film and a conversion layer.

2. Singulating the laminae.

3. Electro-optical characterization.

The laminae can analogously also be coated with other materials and thereby fulfill other functionalities, such as for example as a daylight filter for detectors
as an optical filter for BLU applications (BLU stands for backlight unit)
to represent other colors/offstate color
increasing the contrast between LED & package (that is to say component) surroundings (for example for video walls or shutter edge)
alternatively, the conversion layer or the offstate color layer (color scattering layer) can also be omitted.

A further embodiment provides for using the lamina as an optical element. Exemplary embodiment possibilities are as follows:

coupling-out structures introduced by etching (lens, for example Fresnel structure, planoconvex, concave, etc.).

In addition, alignment structures for example for a secondary optical unit can be applied to the lamina or etched therein.

The lamina may already have been preprocessed mechanically by virtue of e.g. a groove having been introduced on the lamina edge (mold flash-free for FAM (foil assisted molding) or for potting processes as a stop edge) or the lamina having a depression on the top side (casting of converter or $TiO_2$ cavity). In addition, provision is advantageously made for fashioning the lamina such that it is elevated in the center, for example round, in order to obtain a particular optical appearance. Here, for example, the emission face of the chip visually appears round (design feature).

According to the present disclosure, this makes it possible to produce a flat and mechanically stable package (component).

The lamina can be used in particular as follows as structural and conversion element in LEDs:

1. Adhesively bonding the lamina onto an LED chip (which emits visible light and/or UV light and/or IR light). Consequently, the lamina serves as a conversion element and also to generate the corresponding offstate color (that is to say a color impression when the component is switched off, that is to say is not emitting light).

2a. Enclosing/encapsulating the stack (LED chip+lamina) by molding by foil assisted molding (FAM), for example white epoxy mold composite.

2b. Potting up to the upper edge of the lamina with $TiO_2$-filled silicone/epoxy.

2c. Applying a secondary optical unit to the package produced.

White color impression when the component is switched off, is thus generated in particular by the white color scattering layer and the white housing material (white potting compound).

Furthermore, in particular, a visual decoupling of light emitting face (luminous face) and geometry is offstate color (lamina is used as a design element, for example the entire package appears yellow).

Lamina furthermore advantageously acts as a conversion element:

One advantage is, furthermore, that an expedient production process for the lamina at the substrate level is provided; by way of example, 4" glass substrates can be used. Furthermore, a flexible adaptation of the size of the lamina by sawing and/or laser treatment to the corresponding chip size (advantageously rectangular, for example) or as a design element (in the housing) is possible.

The lamina is advantageously electro-optically measured and sorted prior to being applied on the chip, for example in respect of the color locus. Yield losses for example resulting from an incorrect color locus can be reduced as a result.

Furthermore, the component according to the present disclosure has the following advantages:

Expensive ceramic layers such as are known from the prior art can be replaced by the lamina according to the present disclosure. There are currently no warm-white ceramic-phosphor layers.

Furthermore, the stack (chip (or light source)+lamina) can be matched in height to further stacks with the use of a plurality of chips (multi-chip) having different Z-heights on a substrate, for example CoB.

A further advantage is the great flexibility: the use of different phosphor laminae on a CoB module/multi-chip component is possible and provided, for example.

LEDs without a conversion layer which give a white impression visually are for example possible with a lamina without a conversion layer, only with a color scattering layer, wherein a white visual impression arises even given the presence of the conversion layer on account of the white color scattering layer.

The lamina need not necessarily only map the chip dimensions. Larger embodiments are possible and provided, wherein the lamina for example covers (protects) the top side of the package or is placed directly onto a cavity.

FIGS. 11 to 13 in each case show a lamina 1101 respectively in a side view, an oblique plan view and a plan view for an optoelectronic component.

The lamina 1101 includes a base 1103 having a base surface 1105 having an elevated portion 1107. The elevated portion 1107 is round. A surface of the portion 1107 that is at a distance from the base surface 1105 is identified by the reference sign 1109. On the surface 1109, advantageously a color scattering layer (not shown) is applied, in particular additionally a conversion layer (not shown). The lamina 1101 thus has an elevated structure, the elevated portion 1107.

The base 1103 has a square shape having a cutout 1111. That is to say that without the cutout 1111 the base 1103 would be a square. The cutout 1111 is formed in a corner region of the square. Instead of a square, a rectangle is provided in an embodiment that is not shown. The base 1103 is thus formed as a square with one corner cut out. This advantageously creates space for a bonding wire 211 and a corner bonding pad 807, as on the basis of the optoelectronic component 1401 shown in FIG. 14.

A further surface is formed opposite the surfaces 1105 and 1109, said further surface being identified by the reference sign 1113. If the lamina 1101 is placed or arranged onto a luminous face, then said further surface 1113 is that surface of the lamina which faces the luminous face. The surface 1109 then faces away from the luminous face.

A conversion layer can in particular also be applied to the further surface 1113.

According to one embodiment, the base 1103 has a groove. The groove can advantageously be used for example for pouring in a light-absorbing plastic, such that the groove with the plastic poured in forms a region having a lower transmission or a light-nontransmissive region.

Figure 14:
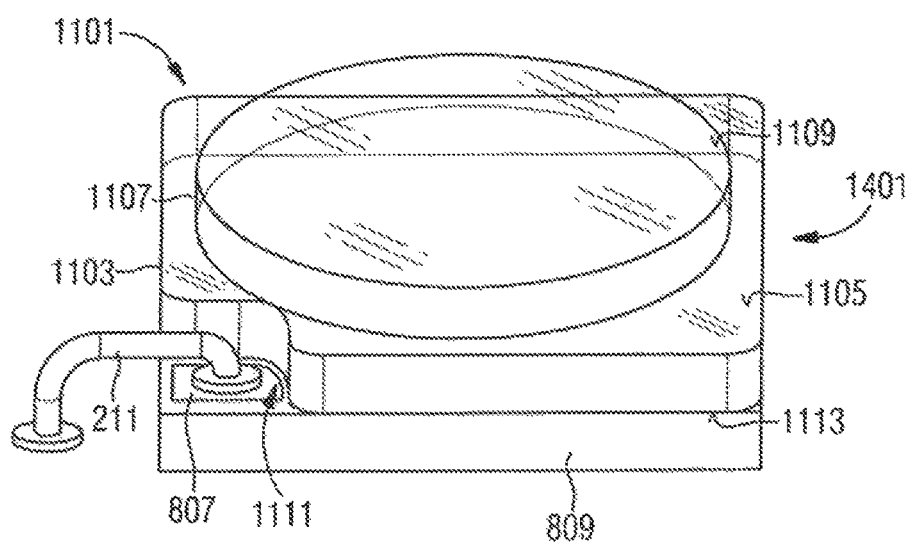
FIG. 14 shows an optoelectronic component including the lamina in accordance with FIGS. 11 to 13.

FIG. 14 shows the lamina 1101 arranged on a luminous face of the optoelectronic component 1401.

Figure 15:
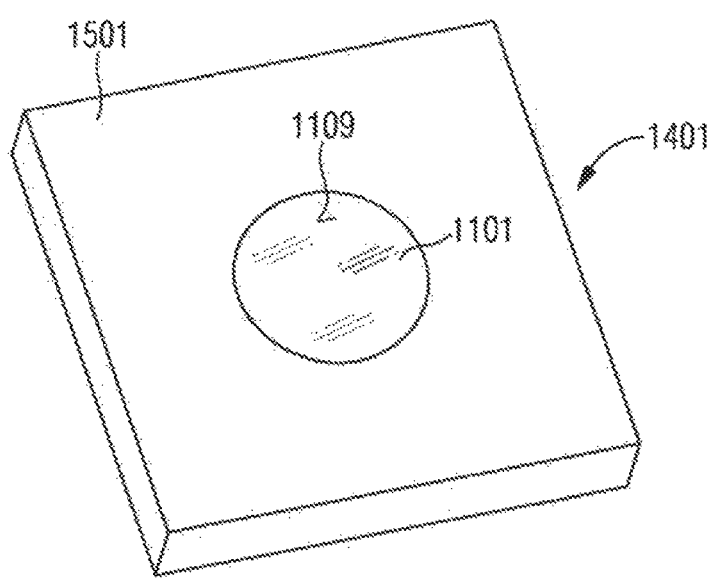
FIG. 15 shows another optoelectronic component and FIG. 16 shows a further optoelectronic component.

FIG. 15 shows the component 1401 with a potting compound 1501, which in the cured state forms a housing for the elements of the component 1401. It is provided that after the potting process, that is to say after curing, the potting compound 1501 is flush with the surface 1109.

Figure 16:
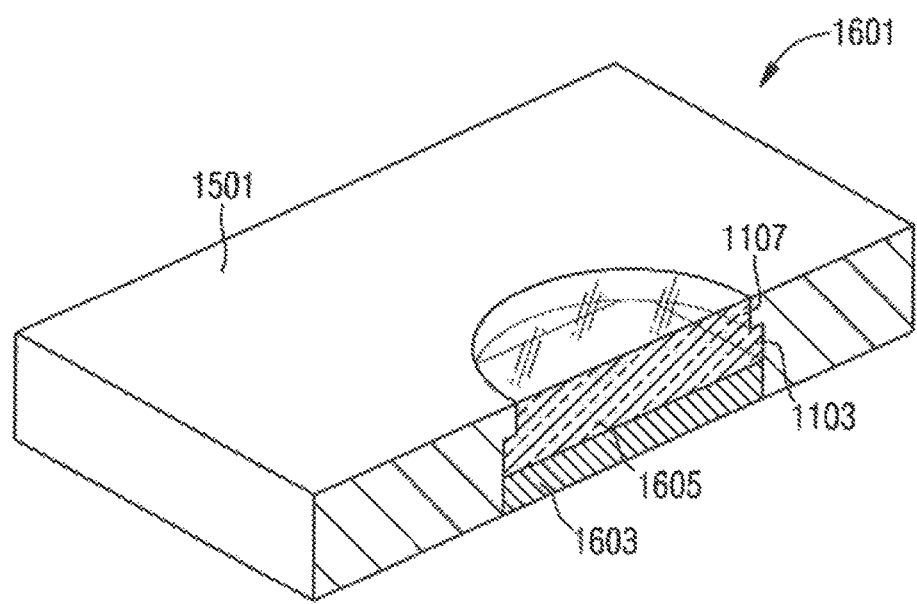

FIG. 16 shows a further component 1601, which is constructed similarly to the component 1401. Here, however, an LED chip 1603 of the component 1601 has a rectangular shape. A lamina 1605 arranged on a luminous face of the LED chip 1603 is formed in a similar manner to the lamina 1101, wherein here the base 1103 having a rectangular shape has a cutout (not shown) for the bonding wire 211 and the corner bonding pad 807. The elevated portion 1107 has a semi-circular shape. In embodiments that are not shown, other shapes are provided, for example a circular shape.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
a carrier, and
a light source formed on the carrier,
wherein the light source has at least one luminous face formed by one or more light emitting diodes, wherein
an at least partly transparent lamina is arranged on the luminous face,
wherein the lamina has an alignment structure for aligning a further component relative to the component;
wherein the lamina has a surface facing the luminous face and a surface facing away from the luminous face, wherein
at least one conversion layer and a color scattering layer for generating a color by light scattering are arranged on at least one of the facing and facing-away surfaces, wherein
the conversion layer is arranged upstream of the color scattering layer relative to an emission direction of light from the luminous face, such that light emitted by the luminous face can first be converted and then be scattered.

2. The optoelectronic component as claimed in claim 1, wherein the lamina has at least one light-nontransmissive region.

3. The optoelectronic component as claimed in claim 1, wherein the lamina is embodied as a lens.

4. The optoelectronic component as claimed in claim 1, wherein the lamina has a cavity on its facing-away surface, at least one of the conversion layer and the color scattering layer being arranged in the cavity.

5. The optoelectronic component as claimed in claim 1, wherein the facing surface has a cutout in which an electrical contacting of the light source is arranged.

6. The optoelectronic component as claimed in claim 1, wherein the lamina has an elevated structure.

7. The optoelectronic component as claimed in claim 1, wherein the lamina is formed from at least one of the following group of elements: glass, transparent ceramic, silicone, hybrid material, in particular silicone/epoxy, plexiglas, sapphire.

8. The optoelectronic component as claimed in claim 1, wherein the lamina has a mechanical structure designed to be used for a further processing process of the component.

9. The optoelectronic component as claimed in claim 8, wherein the mechanical structure has a groove on the lamina edge and/or a stop edge for a potting process.

10. The optoelectronic component as claimed in claim 1, wherein the light source and the lamina are encapsulated by molding and are potted up to an upper edge of the lamina, the upper edge facing away from the light source a potting compound, such that the potting compound is flush with the upper edge.

11. The optoelectronic component as claimed in claim 10, wherein the potting compound has a color identical to the color generated by the color scattering layer.

12. A method for producing an optoelectronic component comprising:
providing an at least partly transparent lamina having two opposite surfaces,
forming at least one conversion layer and a color scattering layer for generating a color by light scattering on at least one of the surfaces of the lamina,
providing a carrier, on which is formed a light source having at least one luminous face formed by one or more light emitting diodes,
arranging the lamina on the luminous face, such that one of the surfaces of the lamina forms a surface facing the luminous face and the other surface of the lamina forms a surface facing away from the luminous face, such that the conversion layer is arranged upstream of the color scattering layer relative to an emission direction of light from the luminous face, such that light emitted by the luminous face can first be converted and then be scattered; wherein the light source with the lamina arranged on the luminous face are encapsulated by molding and are subsequently potted up to an upper edge of the lamina, the upper edge facing away from the light source by a potting compound, such that the potting compound is flush with the upper edge.

13. The method as claimed in claim 12, wherein the lamina with the conversion layer and the color scattering layer is measured in respect of an optical property before being arranged on the luminous face, wherein the lamina is arranged on the luminous face only if the measured optical property corresponds to a predetermined reference property.

14. An optoelectronic component, comprising:
a carrier, and
a light source formed on the carrier,
wherein the light source has at least one luminous face formed by one or more light emitting diodes, wherein
an at least partly transparent lamina is arranged on the luminous face,
wherein the lamina has a mechanical structure designed to be used for a further processing process of the component;
wherein the lamina has a surface facing the luminous face and a surface facing away from the luminous face, wherein
at least one conversion layer and a color scattering layer for generating a color by light scattering are arranged on at least one of the facing and facing-away surfaces, wherein
the conversion layer is arranged upstream of the color scattering layer relative to an emission direction of light from the luminous face, such that light emitted by the luminous face can first be converted and then be scattered.

15. The optoelectronic component as claimed in claim 14, wherein the mechanical structure has a groove on the lamina edge and/or a stop edge for a potting process.

* * * * *